(12) United States Patent  (10) Patent No.: US 7,148,080 B2
Kim et al.  (45) Date of Patent: Dec. 12, 2006

(54) METHOD FOR JOINING LEAD FRAMES IN A PACKAGE ASSEMBLY, METHOD FOR FORMING A CHIP STACK PACKAGE, AND A CHIP STACK PACKAGE

(75) Inventors: Pyoung Wan Kim, Cheonan (KR); Sang Hyeop Lee, Cheonan (KR); Chang Cheol Lee, Cheonan (KR); Gun Ah Lee, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 188 days.

(21) Appl. No.: 10/382,591

(22) Filed: Mar. 7, 2003

(65) Prior Publication Data
US 2004/0014257 A1  Jan. 22, 2004

(30) Foreign Application Priority Data
Jul. 19, 2002  (KR)  .............................. 2002-042539

(51) Int. Cl.
*H01L 21/44* (2006.01)
(52) U.S. Cl. .................... 438/106; 438/123; 257/E21.5
(58) Field of Classification Search ................ 438/106, 438/111, 119, 123; 257/E21.499, E21.5
See application file for complete search history.

(56) References Cited

U.S. PATENT DOCUMENTS

| 4,142,203 | A | * | 2/1979 | Dietz .......................... 257/704 |
| 5,463,253 | A | * | 10/1995 | Waki et al. ................. 257/724 |
| 5,770,479 | A | * | 6/1998 | Brooks et al. ............... 438/123 |
| 5,804,874 | A | * | 9/1998 | An et al. ...................... 257/676 |
| 6,362,022 | B1 | * | 3/2002 | Hinkle et al. ............... 438/123 |
| 6,541,846 | B1 | * | 4/2003 | Vaiyapuri .................... 257/676 |
| 6,762,079 | B1 | * | 7/2004 | Vaiyapuri .................... 438/123 |
| 6,864,566 | B1 | * | 3/2005 | Choi, III ..................... 257/676 |

FOREIGN PATENT DOCUMENTS

| JP | 09017573 | * | 1/1997 |
| KR | 19970067783 | | 10/1997 |
| KR | 19990085220 | | 12/1999 |
| KR | 20010008815 | | 2/2001 |

OTHER PUBLICATIONS

Lee, Ning-Cheng "Reflow Soldering Processes and Troubleshooting", Newnes Press (2002), pp. 2/22, 6/111-6/113, and 11/240.*
Hwang, Jenni S. "Modern Solder Technology for Competitive Electronics Manufacturing" (1996), McGraw-Hill, p. 526.*

* cited by examiner

*Primary Examiner*—Caridad Everhart
(74) *Attorney, Agent, or Firm*—Harness, Dickey & Pierce, P.L.C.

(57) ABSTRACT

A method for joining lead frames in a chip stack package or a package stack, a chip stack package, and a method of forming a chip stack package. A joining mediator is formed on joining portions of at least one lead frame. The joining mediator has an anti-oxidation property and an inter-metallic diffusion property, and may be formed of gold wires, gold bumps, gold bars, solder bumps, solder, or solder bars. By clamping or compressing the lead frames under heat and pressure, the joining mediator forms an inter-metallic joint layer that reliably interconnects the lead frames at the joining portions.

45 Claims, 11 Drawing Sheets

METHOD FOR JOINING LEAD FRAMES IN A PACKAGE ASSEMBLY, METHOD FOR FORMING A CHIP STACK PACKAGE, AND A CHIP STACK PACKAGE

CROSS REFERENCE TO RELATED APPLICATIONS

This U.S. non-provisional application claims priority under 35 U.S.C. §119 to Korean Patent Application No. 2002-42539 filed Jul. 19, 2002, the contents of which are incorporated by reference in its entirety.

BACKGROUND OF THE INVENTION

1. Field of the Invention

The present invention relates generally to package assembly technology, and more particularly to a method for joining two or more lead frames in a chip stack package or a package stack, a method for forming a chip stack package, and a chip stack package.

2. Description of the Related Art

Developments in semiconductor technology and high demands from consumers have created a trend in the electronics industry towards higher memory capacity and smaller footprints. To meet these demands, stack techniques such as stacking semiconductor chips or stacking packages have been introduced.

The package stack has the advantage of reliability since each assembled package has passed both functional and reliability tests. Further, the chip stack package has the advantage of having a reduced size since all of the chips are assembled together in a single package. A conventional chip stack package, typically referred to as a dual-die package (DDP), is shown in FIG. 1. The dual-die package 100 has two semiconductor chips, e.g., a lower semiconductor chip 10 and an upper semiconductor chip 30. The dual-die package 100 also has two lead frames, e.g., a lower lead frame 20 and an upper lead frame 40. The lower and upper lead frames 20 and 40 are joined together by thermo-compression so that the semiconductor chips 10 and 30 face back-to-back. For a good joint, portions of the lead frames 20 and 40 are pre-plated with plating layers 28 and 48, respectively, which can be seen in FIG. 2.

When the pre-plated lead frames 20 and 40 are joined by thermo-compression, the interface between the plating layers 28 and 48 may increase, as is shown in FIG. 2, which reduces the reliability that the semiconductor chips 10 and 30 are tightly connected. Such a drawback can result from oxidation of the plating layers 28 and 48. The oxidation may be promoted by the heat applied during thermo-compression and thus the plating layers 28 and 48 may not be properly joined.

One approach to overcome the above problem is to perform a solder dipping process after the package assembly has been formed. Referring to FIG. 1, the solder dipping process forms a solder coating layer 90 on an outer lead 47 of the upper lead frame 30 as well as on the joining portions of the lead frames 20 and 40. The solder coating layer 90 provides an improved electrical connection between the lower and upper lead frames 20 and 40 respectively.

The solder dipping process is performed after the package assembly process and includes steps such as fluxing, soldering, and cleaning, which can lead to an increase in processing time and a decrease in productivity. Further, the solder dipping process causes a change in the dimensions of the outer lead 47. Such a change may necessitate a modification of the contact pin design of a test socket and a modification in the land pattern design of a module substrate. That is, the outer lead with the solder coating layer cannot use the conventional test socket and module substrate adapted for the outer lead 47.

Further, as seen in FIG. 1, the solder coating layer 90 is deposited more at the curved corners of the outer lead 47 by the solder dipping process. Such portions of the solder coating layer 90 may contaminate the contact pin of the test socket when the outer lead 47 is mechanically contacted with the contact pin. In addition, when the dual-die package 100 is mounted on the module, substrate by soldering, the solder coating layers 90 of the adjacent outer leads 47 may form a solder bridge and cause electrical short-circuiting of the dual die package 100.

SUMMARY OF THE INVENTION

Exemplary embodiments of the present invention provide a method for joining at least two lead frames. The first lead frame can include a plurality of first leads, each having a first bonding portion, a first joining portion, and a first side rail. The second lead frame can include a plurality of second leads, each having a second bonding portion, a second joining portion, outer leads, a dam, and a second side rail. In addition, the first lead can be bent such that the first bonding portion is positioned at a lower level than the first joining portion and the second lead can be bent such that the second bonding portion is at a higher level than the second joining portion.

The first lead frame may further include a first plating layer formed on the first joining portions and a portion of the first side rail. The second lead frame may include a second plating layer formed on the second joining portions and a portion of the dam bar. The first and second plating layers may be formed of silver or solder.

A joining mediator is formed on at least one of the first and second joining portions and can be formed on the first plating layer and/or the second plating layer. The joining mediator has an anti-oxidation property and an anti-metallic diffusion property, and is typically metal wires, metal bumps, or metal bars. The first and second leads are joined by compressing the first and second leads under heat and pressure to form an inter-metallic joint layer from the joining mediator such that the inter-metallic joint layer interconnects the first and second joining portions.

Other exemplary embodiments of the present invention provide a chip stack package and a method for forming a chip stack package. The chip stack package includes a first lead frame that has a first semiconductor chip, a second lead frame that has a second semiconductor chip, and an inter-metallic joint layer interconnecting a portion of the first and second lead frames. The first and second lead frames are stacked together such that the first and second semiconductor chips are positioned adjacent to each other. The chip stack package may also include first electrode pads electrically connecting the first semiconductor chip and a portion of the first lead frame by a first bonding wire and second electrode pads electrically connecting the second semiconductor chip by a second bonding wire. Optionally, the first and second semiconductor chips and at least a portion of the first and second lead frames are encapsulated in a resin body to protect the chip stack package.

To form the chip stack package, a joining mediator, such as is described above, may be formed on the first lead frame and/or the second lead frame. The first and second lead frame are stacked together with the first and second semiconductor chips positioned adjacent to each other and compressed under heat and pressure to form an inter-metallic joint layer from the joining mediator. The inter-metallic joint layer interconnects at least a portion of the first and second lead frames. In addition, the first lead frame and/or the second lead frame may include plating layers which can be formed of silver or solder. The joining mediator may also be formed on the first plating layer and/or the second plating layer.

BRIEF DESCRIPTION OF THE DRAWINGS

Exemplary embodiments of the present invention will be readily understood with reference to the following detailed description thereof provided in conjunction with the accompanying drawings in which.

DETAILED DESCRIPTION OF EXEMPLARY EMBODIMENTS

Figure 1:
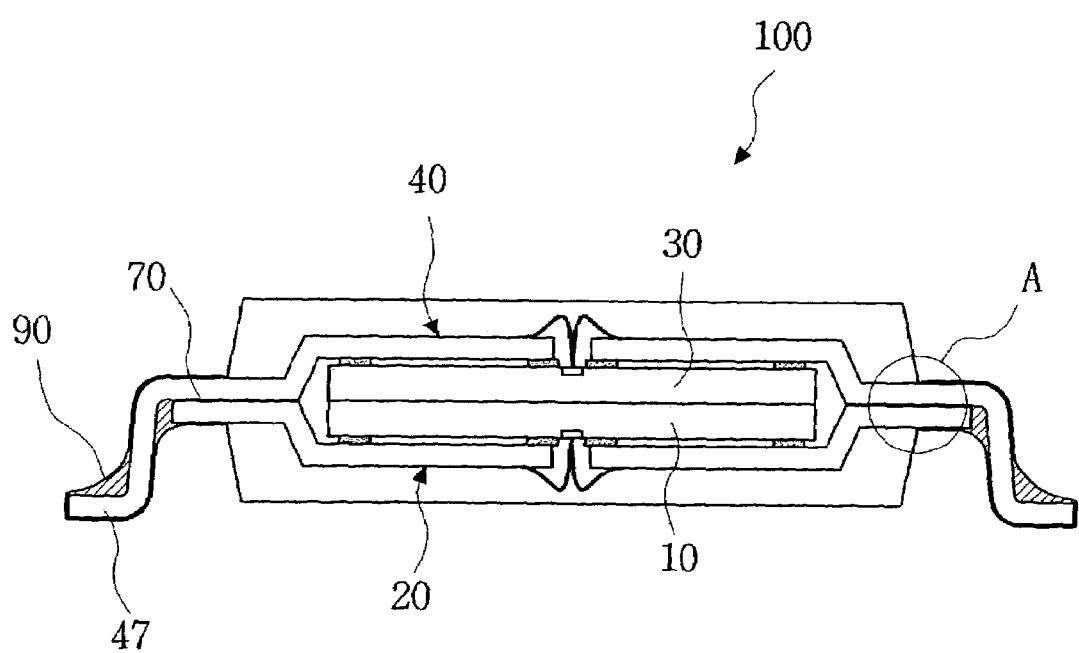
FIG. 1 is a cross sectional view of a chip stack package formed by a conventional method for joining lead frames.
Figure 2:
FIG. 2 is an enlarged view of section "A" shown in FIG. 1, illustrated as a photograph taken by a scanning electron microscope (SEM).

Exemplary embodiments of the present invention will be described more fully below with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete and will fully convey the concept of the present invention to those skilled in the art. In the drawings, the thickness of layers and regions are exaggerated for clarity. It should also be understood that when a layer is referred to as being "on" another layer or a substrate, it can be located directly on the other layer or the substrate, or intervening layers may be present. Throughout the specification, like numbers refer to like elements.

Figure 3:
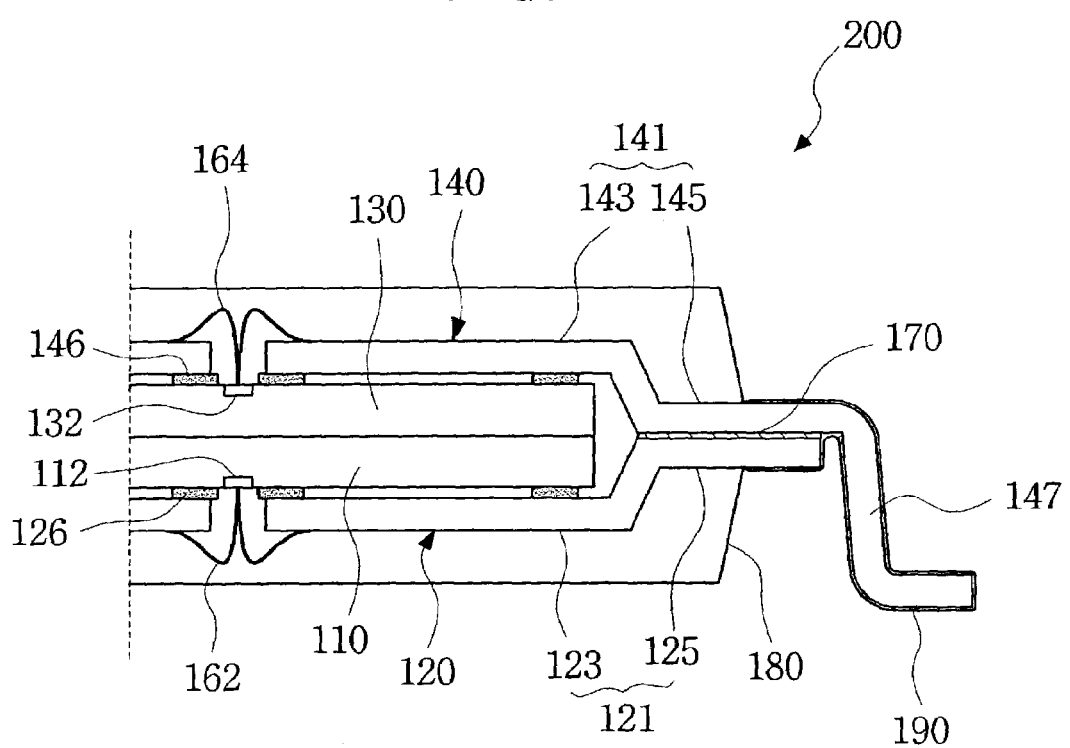
FIG. 3 is a cross sectional view of a chip stack package using a method for joining lead frames in accordance with at least one exemplary embodiment of the present invention.

Referring to FIG. 3, a dual-die package 200 is shown as an example of a chip stack package formed by exemplary embodiments of the present invention. The package 200 has two semiconductor chips, e.g., a first semiconductor chip 110 and a second semiconductor chip 130. Each of the semiconductor chips 110 and 130 has an active surface and a back surface. At least one row of electrode pads 112 and 132 is located along a central line of the active surface of each semiconductor chip 110 and 130.

Figure 4:
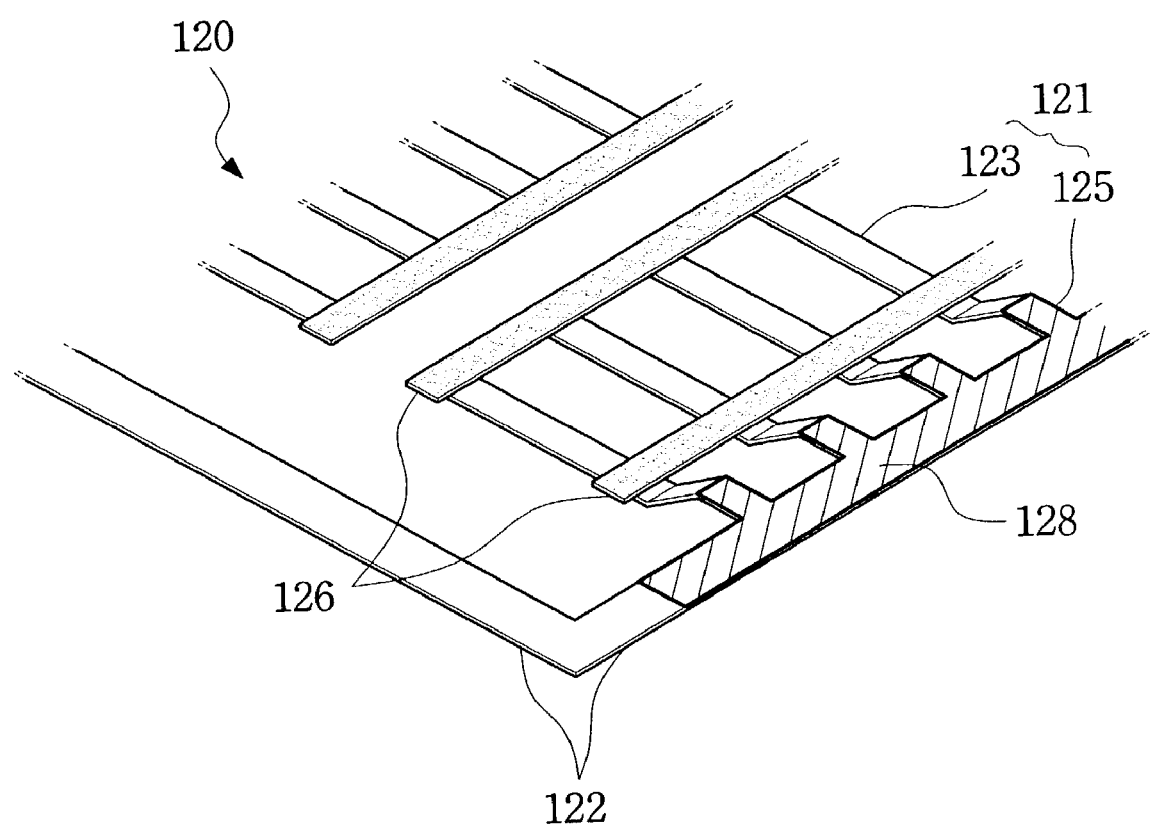
FIG. 4 is a perspective view of a first lead frame according to an exemplary embodiment of the present invention.
Figure 5:
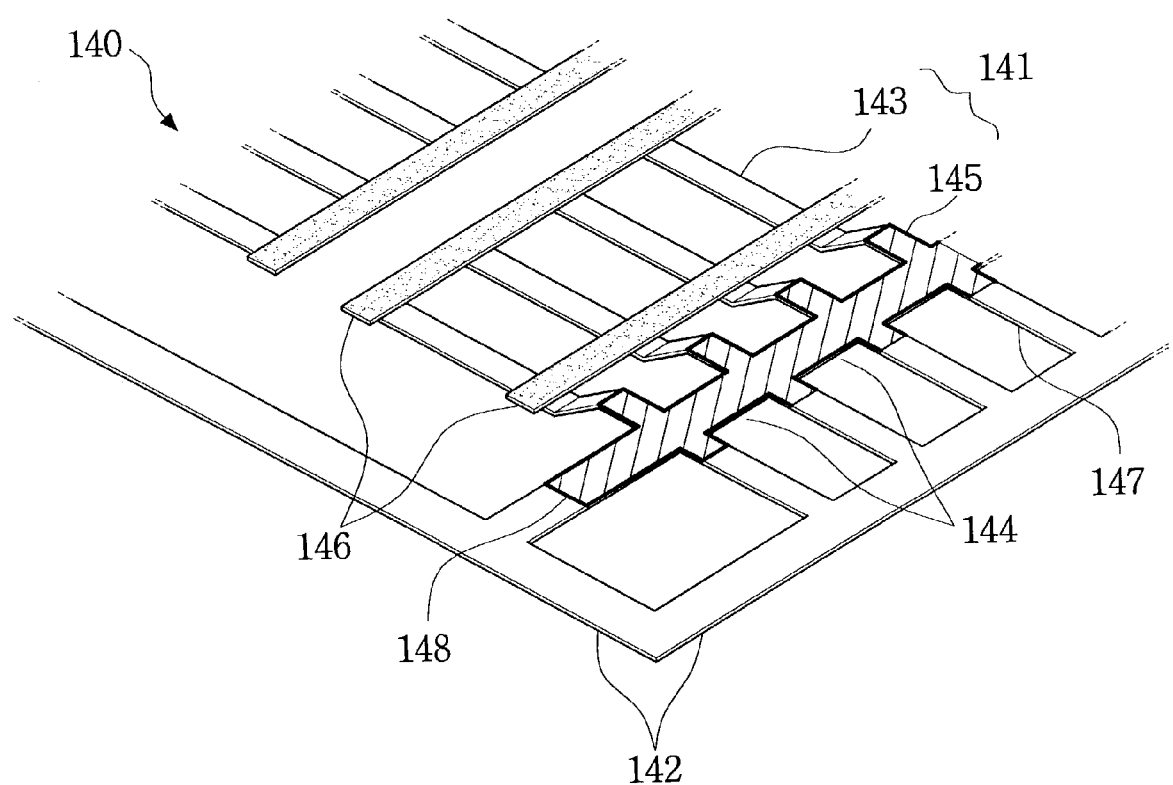
FIG. 5 is a perspective view of a second lead frame according to an exemplary embodiment of the present invention.

The package 200 also has two lead frames, e.g., a first lead frame 120 and a second lead frame 140. As shown in FIGS. 3 and 4, the first lead frame 120 includes first leads 121, each having a first bonding portion 123 and a first joining portion 125. Likewise, as illustrated in FIGS. 3 and 5, the second lead frame 140 includes second leads 141, each having a second bonding portion 143 and a second joining portion 145. The second lead frame 140 further includes outer leads 147 extending from the second leads 141.

The first leads 121 are bent (e.g., downward) such that the first bonding portions 123 are positioned at a lower level than the first joining portions 125. On the other hand, the second leads 141 are bent (e.g., upward) such that the second bonding portions 143 are positioned at a higher level than the second joining portions 145. The first semiconductor chip 110 can be attached to the first bonding portions 123 by an adhesive tape 126 such that the active surface of the first semiconductor chip 110 faces away from the first bonding portions 125 (e.g., downward). However, any suitable adhesive identified by one of skill in the art can be employed. The electrode pads 112 of the first semiconductor chip 110 are positioned between two rows of the first leads 121. The second semiconductor chip 130 can be attached to the second bonding portions 143 by an adhesive tape 146 such that the active surface of the second chip 130 faces away from the second bonding portions 143 (e.g., upward). The electrode pads 132 of the second chip 130 are positioned between two rows of the second leads 141. The first and second leads 121 and 141 are positioned so that the first and second semiconductor chips 110 and 130 are located adjacent to each other.

Each electrode pad 112 and 132 is electrically connected to the corresponding bonding portion 123 and 143 of the first and second leads 121 and 141 by a bonding wire 162 and 164. The semiconductor chips 110 and 130, the bonding wires 162 and 164, and most parts of the first and second leads 121 and 141 can be encapsulated within a resin-molded body 180 for protection from the external and potentially harmful environment.

The first and second joining portions 125 and 145 are joined together and are electrically connected to each other. The outer lead 147 of the second lead frame 140 protrudes from the resin-molded body 180 and acts as a common connection terminal. The outer lead 147 has a shape adapted for mounting on an external circuit board. FIG. 3 illustrates one example of the shape of the outer lead 147, e.g., a gull-wing type, but any other suitable shape can be employed. The outer lead 147 can be plated with tin (Sn) for good mounting on the circuit board. Reference number 190 represents a tin-plating layer.

Each of the joining portions 125 and 145 can have a plating layer (reference numerals 128 and 148 of FIG. 8) such as solder or silver (Ag). First and second joining portions 125 and 145 (including the first and second plating layers 128 and 148 respectively) are joined under heat and pressure through a joining mediator interposed therebetween. The joining mediator has an anti-oxidation property and an inter-metallic diffusion property at a high temperature (e.g., 180° C.). Suitable examples of the joining mediator include gold (Au), e.g., a gold bonding wire, a gold bump, or a gold bar, solder, and a solder bar. The joining mediator creates a strong connection between the first and second lead frames 120 and 140.

FIGS. 4 through 8 illustrate an exemplary method for joining the lead frames to form the chip stack package shown in FIG. 3.

Referring to FIG. 4, the first lead frame 120 is an LOC (lead-on-chip) lead frame such as is typically used in the art. As described above, the first lead frame 120 includes a plurality of first leads 121, which are arranged in two rows. In each first lead 121, the first bonding portion 123 is integrally connected to the first joining portion 125. Before being assembled in a package form, the first lead frame 120 further includes a first side rail 122 connected to the ends of the first joining portions 125. As is well known in the art, the first side rail 122 can act as a dam bar in the molding process. At least one adhesive tape 126 can be attached to each row of the first leads 121. Typically, the adhesive tape 126 is attached to the first bonding portions 123. The first plating layer 128 is formed on the first joining portions 125 and a portion of the first side rail 122. The first plating layer 128 may have an anti-oxidation property at the molding temperature (e.g., approximately 180° C.) and a good inter-metallic diffusion property. Suitable examples for use as the first plating layer 128 include solder and silver (Ag).

As shown in FIG. 5, the second lead frame 140 is also depicted as an LOC lead frame. The second lead frame 140 has a structure similar to the first lead frame 120, except that the second lead frame 140 also includes outer leads 147 and a second dam bar 144. The second dam bar 144 is connected to the ends of the second joining portions 145, and the outer leads 147 extend outwardly from the second dam bar 144. The outer ends of the outer leads 147 and both ends of the second dam bar 144 are connected to a second side rail 142. The second lead frame 140 can also include the second plating layer 148, which is formed on the second joining portion 145 and a portion of the second dam bar 144. The second plating layer 148 can be formed of the same material as the first plating layer 128 of the first lead frame 120, namely solder or silver (Ag).

The first and second semiconductor chips 110 and 130 (shown in FIG. 3) are respectively attached to the first and second lead frames 120 and 140 (shown in FIGS. 4 and 5). Each semiconductor chip 110 and 130 is then electrically connected to each lead frame 120 and 140 by the bonding wires 162 and 164.

Figure 6:
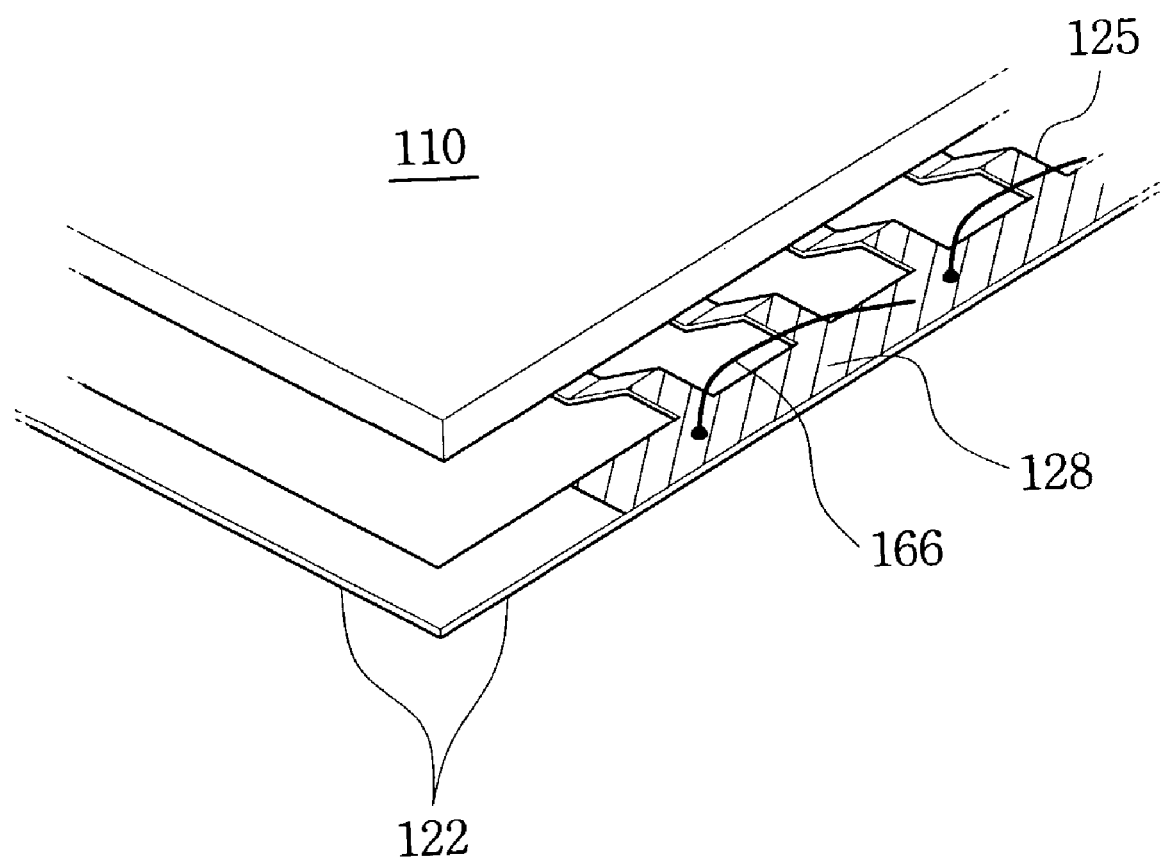
FIG. 6 is a perspective view illustrating bonded wires formed as a joining mediator on the first lead frame in accordance with an exemplary embodiment of the present invention.

Wires 166, which are to be used as the joining mediator, are bonded to the first plating layer 128, as shown in FIG. 6. The bonding wires 166 are discontinuously formed along the first side rail 122 by a typical wire bonding technique, such as ball bonding and/or stitch bonding. The bonding wires 166 in an exemplary embodiment may be made of gold (Au). In addition, the bonding wires 166 may be formed on one or both the first and second lead frames 120 and 140. Whether or not the bonding wires 166 are located on both the first and second lead frames 120 and 140 may depend on the amount of the bonding wires 166 needed for the joining mediator. For example, if it is determined that the second lead frame 140 needs to include the bonding wires 166, the bonding wires 166 are formed along the second dam bar 144.

Although the bonding wire 166 in an exemplary embodiment begins at one location and ends at a different location on the first side rail 122, the bonding wire 166 may begin from one location on the first joining portion 125 and end at a location on the first side rail 122.

Figure 7:
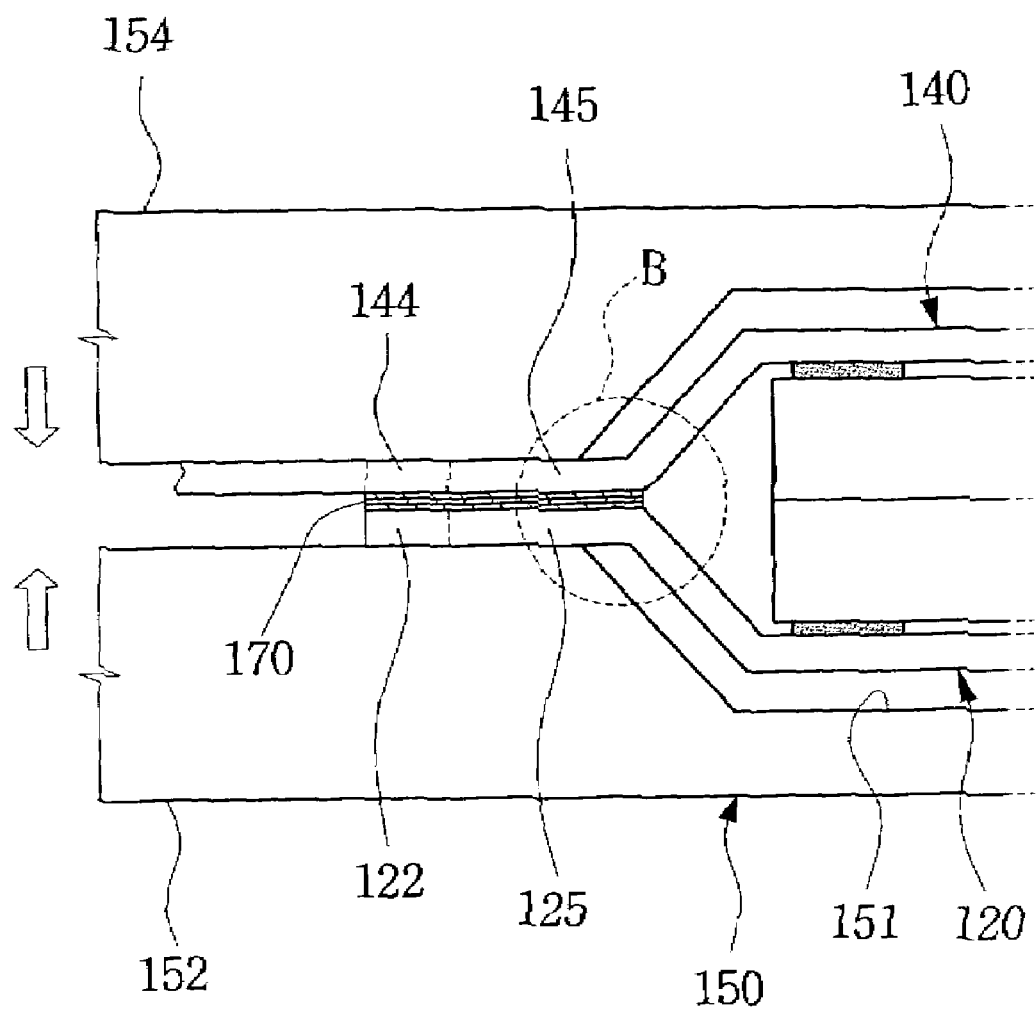
FIG. 7 is a cross sectional view illustrating the first and second lead frames joined by an inter-metallic joint layer in accordance with an exemplary embodiment of the present invention.
Figure 8:
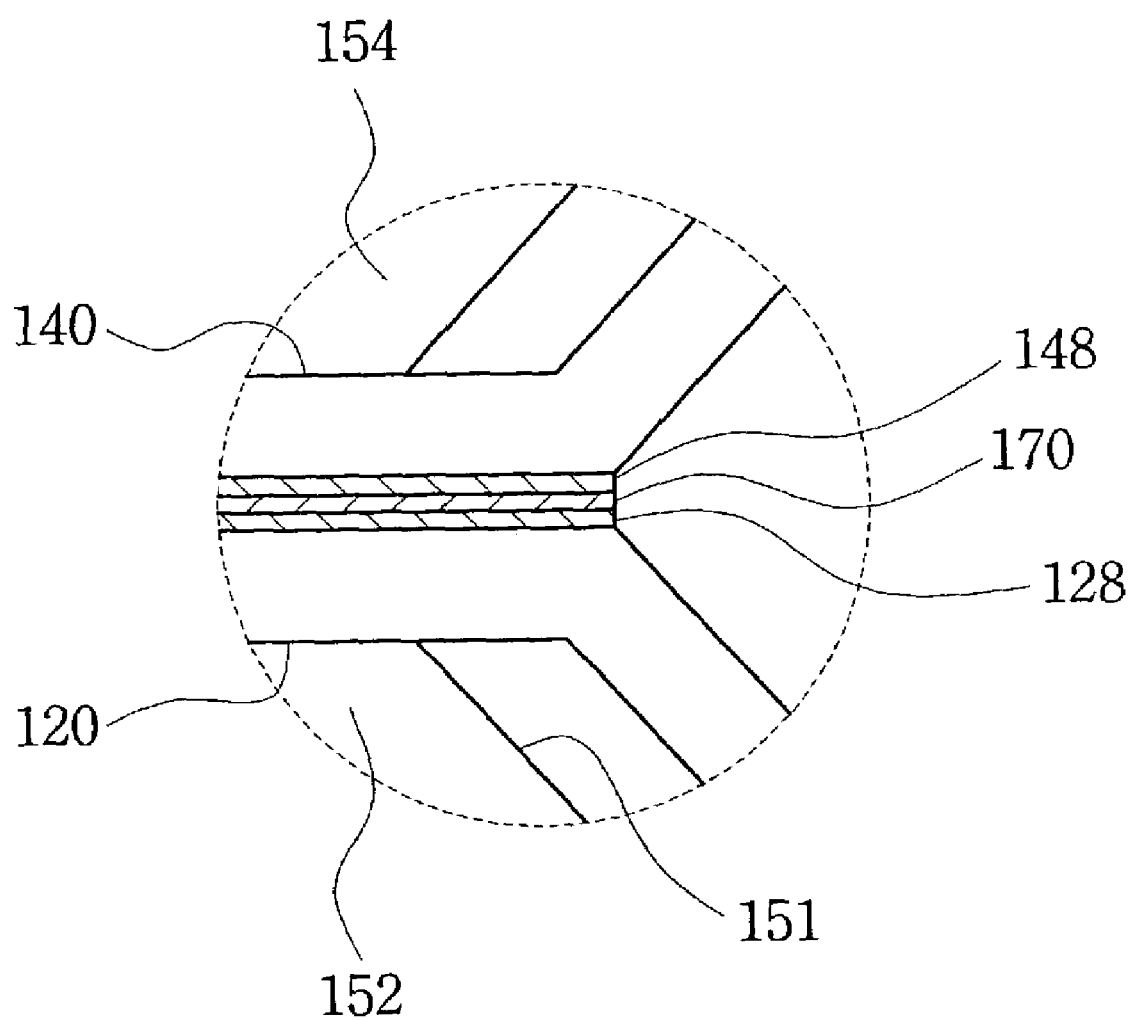
FIG. 8 is an enlarged cross sectional view of section "B" shown in FIG. 7.

As shown in FIGS. 7 and 8, the first and second lead frames 120 and 140 are joined together during a molding process to form a resin-molded body (e.g., reference numeral 180 in FIG. 3). In the molding process, the first lead frame 120, including the first semiconductor chip 100, is placed on a lower mold 152 having a cavity 151. The second lead frame 140, including the second semiconductor chip 130, is then stacked on the first lead frame 120 such that the first and second semiconductor chips 110 and 130 face back-to-back. To inject a liquid molding resin into the cavity 151, an upper mold 154 presses down the lower mold 152 and clamps (e.g., compresses) the first and second lead frames 120 and 140 together under heat and pressure. As a result, the bonding wires 166 are pressed flat and spread between the plating layers 128 and 148 to form an inter-metallic joint layer 170 by diffusion bonding the bonding wires 166 and the first and second plating layers 128 and 148.

For example, if the first joining portion 125 and the first side rail 122 of the first lead frame 120 and the second joining portion 145 and the second dam bar 144 of the second lead frame 130 are clamped (compressed) under a temperature of approximately 175° C. to 185° C. and a force of approximately 70 tons to 110 tons, the bonding wire 166, having a diameter of approximately 30 μm, forms the inter-metallic joint layer 170, which has a thickness of approximately 10 μm to 15 μm. Such a joining process of the first and second lead frames 120 and 140 is simultaneously carried out in a typical molding process without a separate or additional process.

Figure 9:
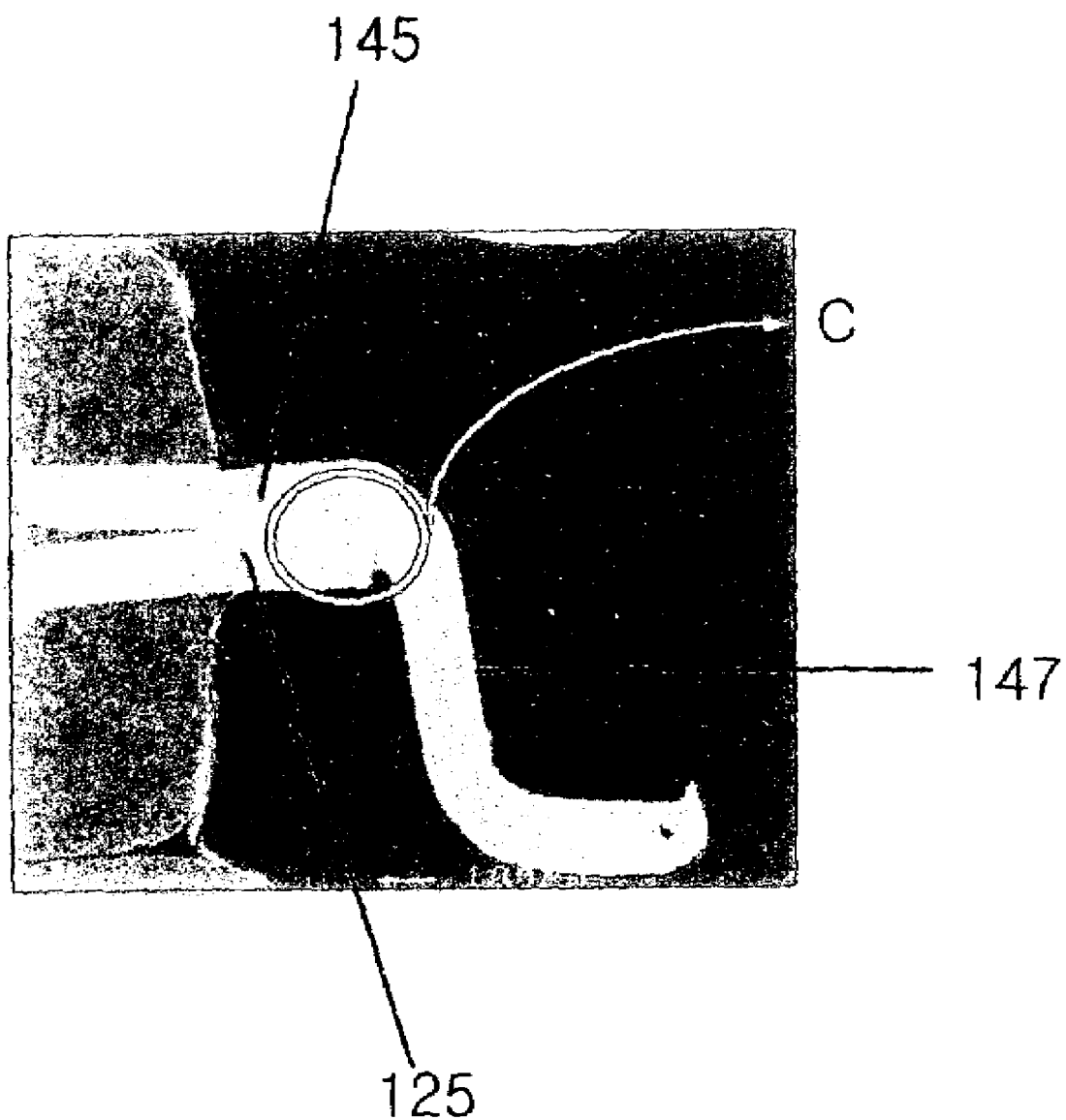
FIG. 9 is a cross sectional view of a joined portion of the first and second lead frames, illustrated as a photograph taken by a scanning electron microscope (SEM) in accordance with an exemplary embodiment of the present invention.
Figure 10:
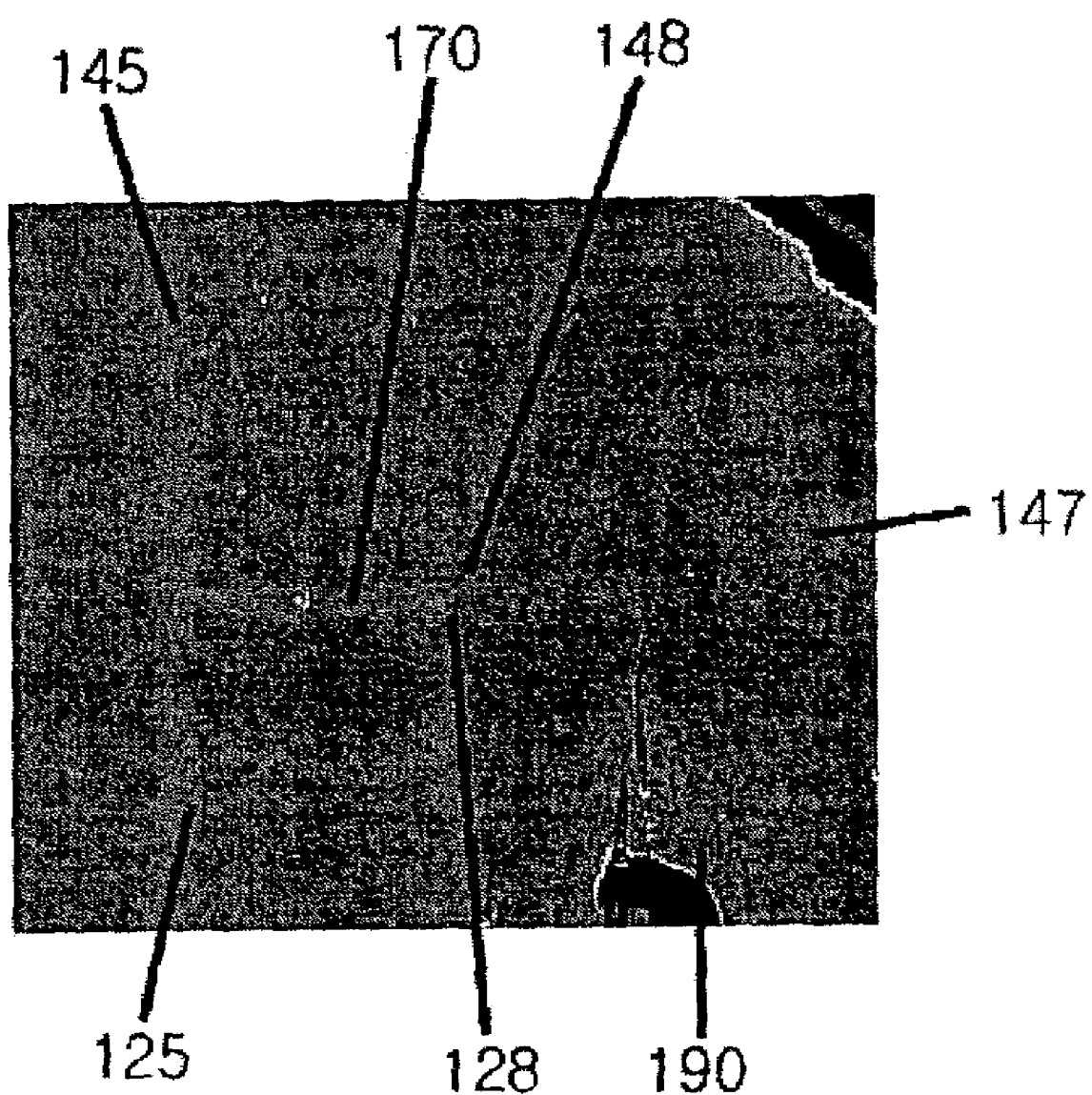
FIG. 10 is an enlarged view of section "C" shown in FIG. 9, illustrated as a photograph taken by a scanning electron microscope (SEM) in accordance with an exemplary embodiment of the present invention.

FIGS. 9 and 10 are photographs taken by a scanning electron microscope (SEM) which show a portion of a chip stack package according to exemplary embodiments of the present invention. In particular, the photographs show two lead frames joined by the above-described exemplary process. In this example, the first and second plating layers 128 and 148 are formed of solder, and gold wires are bonded on the solder plating layer. As seen in FIG. 10, the gold wires form an inter-metallic joint layer 170 between the first and second joining portions 125 and 145. As a result, a more reliable connection between the first and second leads 121 and 141 can be achieved.

Figure 11:
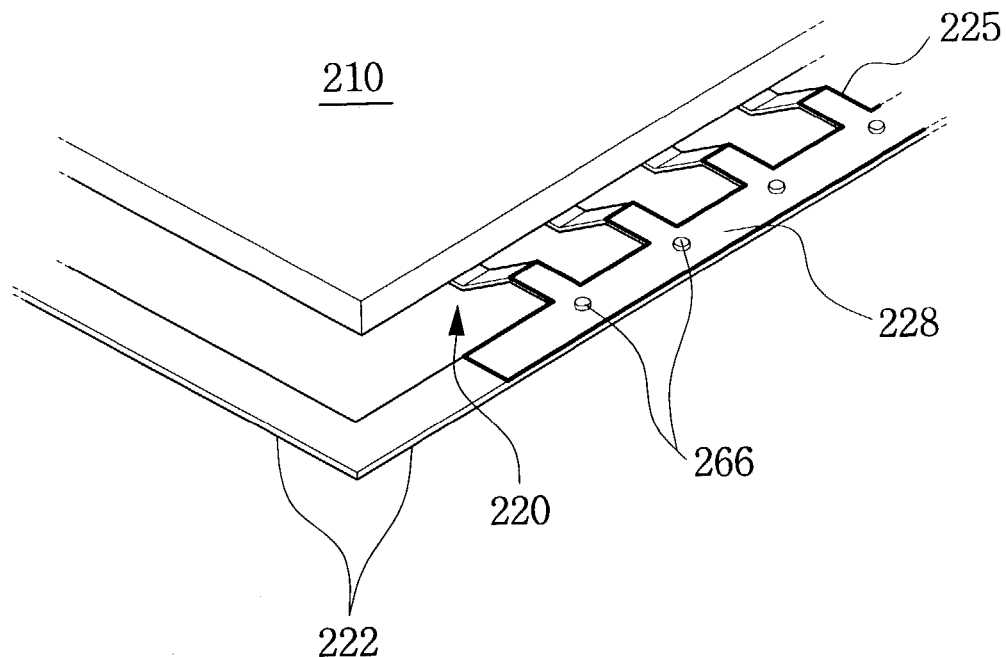
FIG. 11 is a perspective view of gold bumps formed as a joining mediator on a first lead frame in a method for joining lead frames in accordance with another exemplary embodiment of the present invention.

FIG. 11 shows a plurality of gold bumps 266 as another example of the joining mediator used to join the lead frames according to another exemplary embodiment of the present invention. In particular, the gold bumps 266 in this other exemplary embodiment may be employed as the joining mediator as an alternative to the bonded wires 166 used as the joining mediator. The gold bumps 266 may be formed at regular intervals on a first plating layer 228, which is formed on a portion of a side rail 222. A second plating layer (not shown) may be optionally formed on a second lead frame (not shown). Because the first plating layer 228 extends onto joining portions 225 of a lead frame 220, the gold bumps 266 may also be formed on the joining portions 225. The lead frame 220 may correspond to the first lead frame 120. Although FIG. 11 shows the gold bumps 266 on the first lead frame 220, the gold bumps 266 may be formed on the second lead frame (not shown) or on both of the first lead frame 220 and the second lead frame (not shown). If the gold bumps 266 are formed on both the first lead frame 220 and on the second lead frame (not shown), the gold bumps 266 located on the two lead frames need not overlap each other.

Thereafter, similar to the bonded wires 166, the gold bumps 266 form an inter-metallic joint layer (not shown) by diffusion bonding to the plating layer(s) during the molding process. Alternatively, solder bumps (not shown) may be used as the joining mediator instead of the gold bumps 266.

Figure 12:
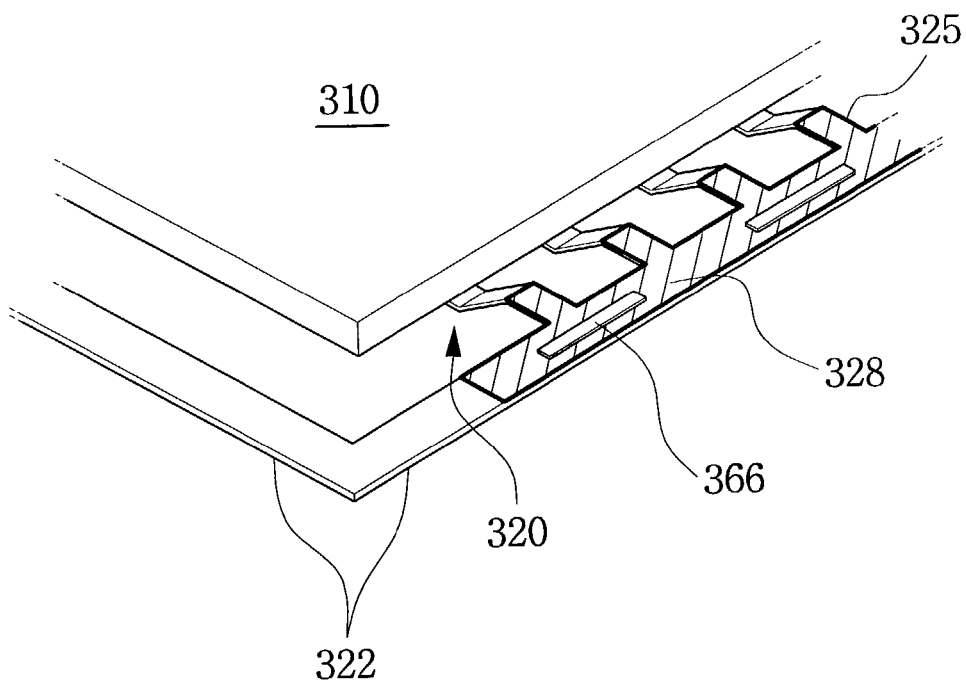
FIG. 12 is a perspective view of gold bars formed as a joining mediator on a first lead frame in a method for joining lead frames in accordance with another exemplary embodiment of the present invention.

FIG. 12 shows at least one gold bar 366 as yet another example of the joining mediator used to form the inter-metallic joint layer and interconnect the lead frames in a further exemplary embodiment of the present invention. As shown in FIG. 12, the gold bar 366 is formed on a plating layer 328 that covers a portion of joining portions 325 and a portion of a side rail 322 of a lead frame 320. The gold bar 366 may be formed on one lead frame or both lead frames. As an alternative to the gold bar 366, a solder bar (not shown) may be used as the joining mediator.

According to exemplary embodiments of the present invention, two or more lead frames can be easily and reliably joined together by using a joining mediator such as wires, bumps, or bars. The methods according to exemplary embodiments of the present invention reduce the need to use conventional solder dipping processes. As a result, problems caused by the use of a solder dipping process can be reduced. Furthermore, since the exemplary methods for joining lead frames may be simultaneously performed during the molding process, the exemplary methods disclosed above for joining lead frames is simplified.

Although exemplary embodiments of this invention have been described in detail hereinabove, it should be understood by those of ordinary skill in the art that various changes in form and details may be made therein and will still fall within the spirit and scope of the present invention as defined in the appended claims.

What is claimed is:

1. A method for joining at least two lead frames, each lead frame having a joining portion, the method comprising:
    placing a joining mediator on at least one of the joining portions; and
    compressing the lead frames together under heat and pressure to transform the entire joining mediator into an inter-metallic joint layer, such that the joining portions of the respective lead frames are interconnected by the inter-metallic joint layer.

2. The method of claim 1, wherein the joining mediator has an anti-oxidation property and an inter-metallic diffusion property.

3. The method of claim 2, wherein the joining mediator is selected from the group consisting of metal wires, metal bumps and metal bars.

4. The method of claim 2, further comprising forming a plating layer on at least one of the joining portions prior to the placing step.

5. The method of claim 4, wherein the plating layer is formed of a member selected from the group consisting of solder and silver.

6. The method of claim 4, wherein in the placing step, the joining mediator is placed on the plating layer.

7. A method for joining at least two lead frames, the method comprising:
    placing a joining mediator on at least one of a first lead frame having a plurality of first leads and a first side rail connected to ends of the first leads and a second lead frame having a plurality of second leads, a dam bar, a plurality of outer leads extending from the second leads, and a second side rail connected to ends of the outer leads; and
    forming an inter-metallic joint layer from the joining mediator by compressing the first lead frame and the second lead frame under heat and pressure such that a portion of the first leads and the second leads are interconnected by the inter-metallic joint layer and the first side rail and the dam bar are interconnected by the inter-metallic joint layer.

8. The method of claim 7, further comprising:
    forming a first plating layer on a portion of the first leads and a portion of the first side rail; and
    forming a second plating layer on a portion of the second leads and a portion of the dam bar.

9. The method of claim 8, wherein the first plating layer and the second plating layer are formed of a member selected from the group consisting of silver and solder.

10. The method of claim 8, wherein the joining mediator is placed on at least one of the first plating layer and the second plating layer.

11. The method of claim 7, wherein the joining mediator has an anti-oxidation property and an inter-metallic diffusion property.

12. The method of claim 11, wherein the joining mediator is selected from the group consisting of metal wires, metal bumps and metal bars.

13. The method of claim 12, wherein the joining mediator is formed of a member selected from the group consisting of gold and solder.

14. The method of claim 7, wherein each of the first leads includes a first bonding portion and a first joining portion and each of the second leads includes a second bonding portion and a second joining portion.

15. The method of claim 14, further comprising:
    forming a first plating layer on the first joining portions and a portion of the first side rail; and
    forming a second plating layer on the second joining portions and a portion of the dam bar.

16. The method of claim 15, wherein the joining mediator is placed on at least one of the first plating layer and the second plating layer.

17. A chip stack package comprising:
    a first semiconductor chip affixed to a first lead frame;
    a second semiconductor chip affixed to a second lead frame, the second lead frame being stacked on the first lead frame such that the first and second semiconductor chips are positioned adjacent to each other; and
    an inter-metallic joint layer interconnecting a portion of the first and second lead frames.

18. The chip stack package of claim 17, further comprising first electrode pads electrically connecting the first semiconductor chip and a portion of the first lead frame by a first bonding wire and second electrode pads electrically connecting the second semiconductor chip and a portion of the second lead frame by a second bonding wire.

19. The chip stack package of claim 17, further comprising a resin molded body surrounding the first and second semiconductor chips and at least a portion of the first and second lead frames.

20. A method of forming a chip stack package according to claim 17 comprising:
    forming a joining mediator on a first lead frame having a first semiconductor chip affixed thereto, the first lead frame including a plurality of first leads;
    stacking the first lead frame on a second lead frame having a second semiconductor chip affixed thereto such that the first and second semiconductor chips are positioned adjacent to each other, the second lead frame including a plurality of second leads; and compressing the first and second lead frames under heat and pressure such that an inter-metallic joint layer is formed from the joining mediator, the inter-metallic joint layer interconnecting a portion of the first and second lead frames.

21. The chip stack package of claim 17, wherein the inter-metallic joint layer is formed from a joining mediator having an anti-oxidation property and an inter-metallic diffusion property.

22. The chip stack package of claim 21, wherein the joining mediator is selected from the group consisting of metal wires, metal bumps and metal bars.

23. The chip stack package of claim 17, wherein the first lead frame comprises:

a plurality of first leads, each first lead including a first bonding portion and a first joining portion.

24. The chip stack package of claim 23, wherein the first leads are bent such that the first bonding portions are positioned a lower level than the first joining portions.

25. The chip stack package of claim 23, wherein the first lead frame further includes a first plating layer located on the first joining portions.

26. The chip stack package of claim 25, wherein the first plating layer is formed of a member selected from the group consisting of silver and solder.

27. The chip stack package of claim 23, wherein the first semiconductor chip has an active surface and is attached to the first bonding portions such that the active surface faces away from the first bonding portions.

28. The chip stack package of claim 27, wherein the first semiconductor chip is affixed to the first bonding portions by adhesive tape.

29. The chip stack package of claim 18, wherein the second lead frame comprises:

a plurality of second leads, each second lead including a second bonding portion and a second joining portion;

a second dam bar connected to ends of the second joining portions; and a plurality of outer leads extending from the second dam bar.

30. The chip stack package of claim 29, wherein the second leads are bent such that the second bonding portions are positioned at a higher level than the second joining portions.

31. The chip stack package of claim 30, wherein the second lead frame further includes a second plating layer formed on the second joining portions.

32. The chip stack package of claim 31, wherein the second plating layer is formed of a member selected from the group consisting of silver and solder.

33. The chip stack package of claim 29, wherein the second semiconductor chip has an active surface and is attached to the second bonding portions such that the active surface faces away from the second bonding portions.

34. A method of forming a chip stack package comprising:

forming a joining mediator on a first lead frame having a first semiconductor chip affixed thereto, the first lead frame including a plurality of first leads;

stacking the first lead frame on a second lead frame having a second semiconductor chip affixed thereto such that the first and second semiconductor chips are positioned adjacent to each other, the second lead frame including a plurality of second leads; and compressing the first and second lead frames under heat and pressure such that an inter-metallic joint layer is formed from the joining mediator, the inter-metallic joint layer interconnecting a portion of the first and second lead frames.

35. The method of claim 34, further comprising encapsulating the first and second semiconductor chips and at least a portion of the first and second lead frames in a resin molded body.

36. The method of claim 34, wherein the joining mediator has an anti-oxidation property and an inter-metallic diffusion property.

37. The method of claim 36, wherein the joining mediator is selected from the group consisting of metal wires, metal bumps and metal bars.

38. The method of claim 34, wherein each of the first leads includes a first bonding portion and a first joining portion and each of the second leads includes a second bonding portion and a second joining portion.

39. The method of claim 38, further comprising electrically connecting electrode pads positioned on the first and second semiconductor chips to the corresponding first and second bonding portions by bonding wires.

40. The method of claim 38, further comprising:

bending the first leads such that the first bonding portions are positioned at a lower level than the first joining portions; and bending the second leads such that the second bonding portions are positioned at a higher level than the second joining portions.

41. The method of claim 38, further comprising:

affixing the first semiconductor chip to the first bonding portions via adhesive tape; and affixing the second semiconductor chip to the second bonding portions via adhesive tape.

42. The method of claim 38, further comprising forming a first plating layer on at least the first joining portions.

43. The method of claim 42, wherein the first plating layer is formed of a member selected from the group consisting of silver or solder.

44. The method of claim 42, wherein the joining mediator is formed on the first plating layer.

45. A method for joining at least two lead frames, each lead frame having a joining portion, the method comprising:

placing a joining mediator on at least one of the joining portions;

placing a semiconductor chip on each lead frame; and forming an inter-metallic joint layer from the joining mediator by compressing the lead frames together under heat and pressure such that the joining portions of the respective lead frames are interconnected by the inter-metallic joint layer to create a chip stack package according to claim 17.

* * * * *